(12) United States Patent
Tserng et al.

(10) Patent No.: US 6,215,136 B1
(45) Date of Patent: Apr. 10, 2001

(54) INTEGRATED CIRCUIT CAPABLE OF LOW-NOISE AND HIGH-POWER MICROWAVE OPERATION

(75) Inventors: Hua Quen Tserng, Dallas; Paul Saunier, Garland, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/089,359

(22) Filed: Jul. 9, 1993

Related U.S. Application Data

(62) Division of application No. 07/973,906, filed on Nov. 10, 1992, now Pat. No. 5,254,492.

(51) Int. Cl.[7] .................................................. H01L 31/072
(52) U.S. Cl. ........................................... 257/192; 257/194
(58) Field of Search .................................. 257/192, 194, 257/195, 280, 284

(56) References Cited

U.S. PATENT DOCUMENTS

| | | | |
|---|---|---|---|
| 4,733,283 | * | 3/1988 | Kuroda .................................. 257/195 |
| 4,866,490 | * | 9/1989 | Itoh ....................................... 257/194 |
| 5,043,776 | * | 8/1991 | Hida ..................................... 257/192 |
| 5,091,759 | * | 2/1992 | Shih et al. ............................. 257/192 |
| 5,302,840 | * | 4/1994 | Takikawa ............................. 257/192 |

* cited by examiner

*Primary Examiner*—Sara Crane
(74) *Attorney, Agent, or Firm*—Michael K. Skrehot; W. James Brady, III; Frederick J. Telecky, Jr.

(57) ABSTRACT

Generally, and in one form of the invention, an integrated circuit is disclosed for providing low-noise and high-power microwave operation comprising: an epitaxial material structure comprising a substrate 10, a low-noise channel layer 14, a low-noise buffer layer 16, a power channel layer 18, and a moderately doped wide bandgap layer 20; a first active region 24 comprising a first source contact 32 above the wide bandgap layer 22, a first drain contact 36 above the wide bandgap layer 22, wherein the first source contact 32 and the first drain contact 36 are alloyed and thereby driven into the material structure to make contact with the low-noise channel layer 14, and a first gate contact 28 to the low-noise buffer layer 16; and a second active region 26 comprising a second source contact 34 above the wide bandgap layer 22, a second drain contact 38 above the wide bandgap layer 22, wherein the second source contact 34 and the second drain contact 38 are alloyed and thereby driven into the material structure to make contact with the power channel layer 18, and a second gate contact 30 to the wide bandgap layer 22; wherein the first active region 24 and the second active region 26 are electrically isolated from one another, and whereby the integrated circuit is formed with all epitaxial layers formed during a single epitaxial growth cycle and is capable of providing low-noise, high-power, and switching operation at microwave frequencies.

10 Claims, 1 Drawing Sheet

INTEGRATED CIRCUIT CAPABLE OF LOW-NOISE AND HIGH-POWER MICROWAVE OPERATION

This is a division of application Ser. No. 07/973,906, filed Nov. 10, 1992 now U.S. Pat. No. 5,254,492.

FIELD OF THE INVENTION

This invention generally relates to integrated circuits capable of low-noise and high-power microwave operation.

BACKGROUND OF THE INVENTION

Field Effect Transistors (FETs) are well known to be ideal for use in applications requiring amplification or switching at radio or microwave frequencies. FETs fabricated primarily of GaAs are particularly suited for high frequency uses because of the high electron mobility characteristic of this compound semiconductor. In the past, FETs have utilized a Shottky barrier gate structure (hence the common name Metal-semiconductor Field Effect Transistor, or MESFET) and have been fabricated on semi-insulating GaAs substrates with all dopants being ion implanted.

Recently, the performance demands of modern radar and telecommunications equipment have outstripped the capabilities of traditional MESFET technology. Consequently, FETs have evolved into largely epitaxial structures where semiconductor layers are precisely grown and doped in situ in the growth process. This has allowed the use of highly doped, precisely defined, channel regions buried beneath lightly doped buffer layers, which in turn results in "low-high" FETs with a highly linear relationship between transconductance and gate voltage, a characteristic that is important in minimizing distortion in a high-frequency transistor amplifier.

Additionally, FETs have evolved to permit operation with higher breakdown voltages and therefore at higher power than was possible with traditional MESFETs. One method to achieve higher breakdown voltages in the past has been to incorporate an AlGaAs buffer layer atop a GaAs channel layer. The AlGaAs layer is undoped or lightly doped and separates the highly doped GaAs channel from the gate contact placed on top of the AlGaAs layer. This device is known generally as a MISFET (Metal Insulator Field Effect Transistor) because of the "insulating" AlGaAs layer.

Radar and telecommunications systems commonly require the low-noise highly linear performance of "low-high" FETs for receiver amplifiers, while also requiring the high power, robust structure characteristic of a MISFET type transistor amplifier for transmitting applications. This has traditionally required a system designer to have integrated circuits for power amplifiers, integrated circuits for low-noise amplifiers, and even integrated circuits for the switching and phase shifting functions commonly used in these systems.

SUMMARY OF THE INVENTION

In the past, high frequency systems have been of a generally modular nature, having separate integrated circuits for power, low-noise, switching and phase shifting functions. This approach was made necessary largely by the process and epitaxial material structure requirements of the FETs used in the integrated circuits available to the system designer. The necessity to use separate integrated circuits for each system function drives up system cost and adversely impacts the reliability of the system because of the inter-chip connections required. It is these limitations that the present invention is intended to address.

There have been efforts in the past to integrate FETs having different performance advantages, but these circuits required epitaxial regrowth, i.e. a multilayer epitaxial structure was grown for a first type of device but then the epitaxial processing was stopped and other processing done (e.g. epitaxial material was then etched away in areas of the wafer in which a second device type was needed), and then epitaxial processing was resumed with a second epitaxial material structure being grown for the second device type. It is very difficult to obtain a good second epitaxial growth because of contaminants introduced into an epitaxial material growth chamber when it is opened. This process is also time-consuming and requires expert supervision. Consequently, a structure requiring only one epitaxial processing cycle and conventional processing would be desired to overcome these limitations. The present invention is intended to address these limitations.

In one form of the invention, an integrated circuit is disclosed for providing low-noise and high-power microwave operation conprising: an epitaxial material structure comprising a substrate, a low-noise channel layer, a low-noise buffer layer, a power channel layer, and a moderately doped wide bandgap layer, a first active region comprising a first source contact above the wide bandgap layer, a first drain contact above the wide bandgap layer, wherein the first source contact and the first drain contact are alloyed and thereby driven into the material structure to make contact with the low-noise channel layer, and a first gate contact to the low-noise buffer layer, and a second active region comprising a second source contact above the wide bandgap layer, a second drain contact above the wide bandgap layer, wherein the second source contact and the second drain contact are alloyed and thereby driven into the material structure to make contact with the power channel layer, and a second gate contact to the wide band-gap layer; wherein the first active region and the second active region are electrically isolated from one another, and whereby the integrated circuit is formed with all epitaxial layers formed during a single epitaxial growth cycle and is capable of providing low-noise, high-power, and switching operation at microwave frequencies.

In another form of the invention, an integrated circuit is disclosed for providing low-noise and high-power microwave operation comprising: an epitaxial material structure comprising a semi-insulating GaAs substrate, a GaAs buffer layer, a GaAs highly-doped low-noise channel layer, a GaAs lightly-doped low-noise buffer layer, a GaAs highly-doped power channel layer, a moderately doped AlGaAs buffer layer, and a GaAs highly-doped cap layer, a low-noise field effect transistor comprising a first source contact to the cap layer, and a first drain contact to the cap layer, wherein the first source contact and the first drain contact are alloyed and thereby driven into the material structure to make contact with the low-noise channel layer, a first gate contact to the GaAs lightly-doped low-noise buffer layer, the first gate contact being formed with a double recess etch; a power field effect transistor comprising a second source contact to the cap layer, and a second drain contact to the cap layer, wherein the second source contact and the second drain contact are alloyed and thereby driven into the material structure to make contact with the power channel layer, and a second gate contact to the AlGaAs buffer layer, the second gate contact being formed with a double recess etch; and wherein the first active region and the second active region are separated by a region of the material structure rendered semi-insulating by ion implantation.

In yet another form of the invention, a method is disclosed for fabricating an integrated circuit for providing low-noise and high-power microwave operation comprising: depositing a buffer on a substrate; depositing a low-noise channel layer above the buffer, depositing a low-noise buffer layer above the low-noise channel layer, depositing a power channel layer above the low-noise buffer layer, depositing a wide bandgap layer above the power channel layer, depositing a cap layer above the wide bandgap layer, forming a first transistor configuration by etching the cap layer, the wide bandgap layer, and the power channel layer in a first pattern to form a first recess exposing the low-noise buffer layer, forming a second transistor configuration by etching the cap layer in a second pattern to form a second recess exposing the wide bandgap layer, etching a third recess inside of the first recess that extends slightly into the low-noise buffer layer, etching a fourth recess inside of the second recess that extends slightly into the wide bandgap layer, depositing a first gate metallization in the third recess; depositing a second gate metallization in the fourth recess; depositing a first drain contact on the cap layer on one side of the first recess and a first source contact on an opposite side of the first recess; and depositing a second drain contact on the cap layer on one side of the second recess and a second source contact on an opposite side of the second recess, wherein the contacts are alloyed and driven through the cap layer, the wide bandgap layer, the power channel layer, and the low-noise buffer layer to make contact with the low-noise channel layer and the power channel layer.

An advantage of the invention is that a single-chip solution to the needs of high-power and low-noise amplification and switching at state-of-the-art performance levels is made possible. In addition, the processing and material growth is simpler than in prior art solutions, because no regrowth of epitaxial material is required. All epitaxial material growth is done prior to processing.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
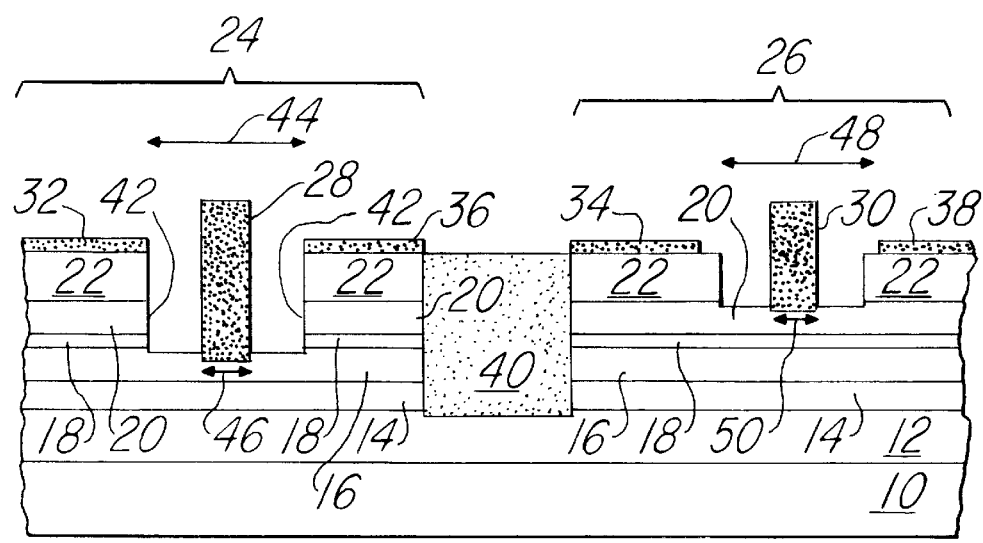
FIG. 1 is a cross-sectional view of a first preferred embodiment circuit integrated low-noise and power FETs.

In a first preferred embodiment of the invention, shown in FIG. 1, a low-noise FET and a power FET are contracted of a common epitaxial material structure. The material structure includes a semi-insulating GaAs substrate 10 with the following layers deposited on the substrate by Molecular Beam Epitaxy (MBE), Metal-Organic Chemical Vapor Deposition (MOCVD), or other such suitable method: a semi-insulating GaAs buffer layer 12 of thickness in the range between about 0.1 and 0.5 $\mu$m (preferably about 0.1 $\mu$m), or alternatively a superlattice buffer of alternating thin AlAs and GaAs layers about 20 Angstroms in thickness; an approximately 300 Angstrom thick layer of GaAs 14, or alternately InGaAs, doped with Si, for example, to a concentration of approximately $1\times10^{18}$ cm$^{-3}$; an approximately 500 Angstrom thick layer of GaAs 16, doped with Si, for example, to a concentration of approximately $5\times10^{16}$ cm$^{-3}$; an approximately 700 Angstrom thick layer 18 of GaAs, or alternately of InGaAs, doped to a concentration of approximately $3\times10^{17}$ cm$^{-3}$, with Si, for example; a layer of Al$_x$Ga$_{1-x}$As 20, where x is approximately 0.3, having a thickness in the range of approximately 500 to 1000 Angstroms (preferably about 800 Angstroms), doped with Si, for example, to a concentration of approximately $1\times10^{17}$ cm$^{-3}$; and a GaAs cap layer 22, having a thickness in the range of approximately 500 to 1000 Angstroms (preferably about 1000 Anstroms), doped with Si, for example, to a concentration of approximately $5\times10^{18}$ cm$^{-3}$.

Layer 14, the low-noise channel layer, acts as the channel for the low-noise device, 24, while layer 16, the low-noise buffer layer, is a lightly doped buffer layer used to separate the gate 28 and layer 14. GaAs layer 18, the power channel layer, together with underlying layers 14 and 16, acts as the channel for the power device 26 and is separated from gate 30 by wide bandgap Al$_x$Ga$_{1-x}$As buffer layer 20. The use of a wide bandgap material, such as AlGaAs for layer 20 provides the Shottky gate 30 with a higher breakdown voltage capability than would be possible with a GaAs buffer layer. This is an important advantage for the power FET 26. GaAs cap layer 22 is heavily doped to facilitate ohmic source 32, 34 and drain 36, 38 contacts. The source and drain contacts can be, for example, AuGeNi. The contacts are alloyed at approximately 450° C. for about 2 minutes, thereby driving the contact material through layers 22 and 18 and into layer 16. The low-noise device 24 and power device 26 are separated by ion implantation isolation as represented in FIG. 1 by region 40. This implantation serves to convert the epitaxial semiconductor layers to a semi-insulating region, thereby isolating the low-noise 24 and power 26 devices.

The gate 28 of the low-noise device is constructed by reactive ion etching (RIE) through layers 22, 20, 18, and slightly (about 200 Angstroms) into GaAs layer 16. The use of this dry etching process produces near-vertical sidewalls 42. The width of this first gate recess 44 is approximately 3 $\mu$m. The first recess etch is then followed by a second recess etch to form recess 46, which has a width of approximately 0.5 $\mu$m. Gate metal 28, for example Ti/Pt/Au, is then evaporated in second recess 46. Similarly, the gate 30 of power device 26 is constructed using RIE to etch through cap layer 22, and slightly (about 300 Angstroms) into layer 20. This first recess 48 is approximately 3 $\mu$m in width. Again, a second recess etch is performed to produce recess 50. Gate metal 30, for example Ti/Pt/Au, is then evaporated into second recess 50.

Figure 2:
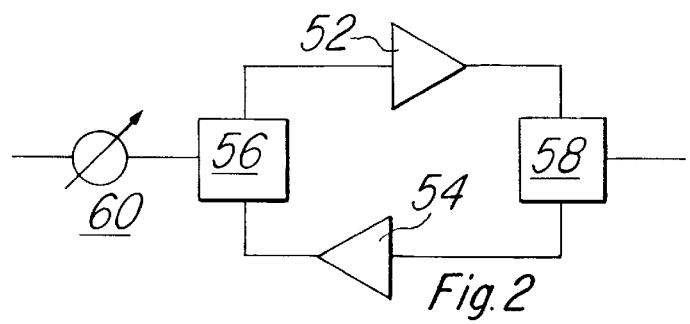
FIG. 2 is a system block diagram of the functions that can be integrated onto a single substrate using low-noise and power FETs.

A second preferred embodiment of the inventive concept, a transmitter and receiver integrated circuit is shown in FIG. 2. Traditionally, the power amplifier 52, low-noise amplifier 54, transmit/receive switches 56, 58, and phase shifter 60 have been fabricated as separate integrated circuits. This is due to the fact that the specialized performance requirements of each circuit have required that different types of transistors be used. Indeed, the design of monolithic amplifiers of a single FET type is well known. However, the present inventive concept allows the integration of these specialized functions that demand different device types onto a single substrate, thereby reducing parts count and handling risks. It also eliminates the need for inter-chip wiring, a major source of reliability and yield problems in high-frequency systems.

Power amplifier 52 is typically designed to incorporate the power transistor 26 because of its high breakdown voltage. A typical amplifier might have several 0.5 $\mu$m-long gate "fingers" to increase the total area available in the transistor for amplification. In addition, the amplifier might include matching and bias networks made of selectively deposited metal inductive transmission line lengths and parallel-plate capacitors formed on the GaAs substrate. Such circuits are known in the art. Resistors can also be formed on the substrate by depositing a layer of TaN, for example, in a thickness and area to give a desired resistance. Additionally, resistors may be formed of one of the layers of the epitaxial material structure, or even by ion implanting dopants into a region of the semi-insulating GaAs substrate.

Low-noise amplifier 54 is typically designed to incorporate the low-noise "high-low" FET 24 because of its highly linear performance characteristics. Again a typical amplifier might have several gate fingers to provide gain or power. The matching and bias networks described above for the power amplifier might be used for the low-noise amplifier as well.

In addition, transmit/receive switches 56 and 58 could easily be monolithically integrated with the amplifiers. Typically, the switch 56 in the receive path is required to be low-loss, and is not required to handle a great deal of power. Consequently, a switch designed around low-noise FET 24 could be appropriate. Conversely, switch 58 is in the high-power transmit path and would benefit from the use of the high breakdown voltage transistor 26. Even the phase shift functions so often required in phased array radar applications could be integrated onto the same substrate. Phase shifters are typically designed as switched line lengths to provide discrete phase increments, and are required to be low-loss as well. Again the use of low-noise transistor 24 switches is appropriate.

A few preferred embodiments have been described in detail hereinabove. It is to be understood that the scope of the invention also comprehends embodiments different from those described, yet within the scope of the claims. For example, the preferred embodiments describe structures fabricated using GaAs layers and an AlGaAs layer. It should be noted that any lattice matched heterojunction material system could be used in this invention. For example, InP/GaInAsP, CdTe/HgCdTe, InGaAs/AlGaAs, or GaAs/GaInP could be used.

Internal and external connections can be ohmic, capacitive, direct or indirect, via intervening circuits or otherwise. Implementation is contemplated in discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit for providing low-noise and high-power microwave operation comprising:
   a material structure compising:
      a substrate;
      a low-noise cbannel layer;
      a low-noise buffer layer;
      a power channel layer; and
      a wide bandgap layer;
   a first active region comprising:
      a first source contact above said wide bandgap layer;
      a first drain contact above said wide bandgap layer, wherein said first source contact and said first drain contact are alloyed and thereby driven into said material structure to make contact with said low-noise channel layer; and
      a first gate contact to said low-noise buffer layer; and
   a second active region comprising:
      a second source contact above said wide bandgap layer;
      a second drain contact above said wide bandgap layer, wherein said second source contact and said second drain contact are alloyed and thereby diven into said material structure to make contact with said power channel layer; and
      a second gate contact to said wide band-gap layer;
   wherein said first active region and said second active region are electrically isolated from one another.

2. The integrated circuit of claim 1 wherein said substrate, said low-noise channel layer, and said power channel layer are GaAs.

3. The integrated circuit of claim 1 wherein said low-noise channel layer is InGaAs.

4. The integrated circuit of claim 1 wherein said power channel layer is InGaAs.

5. The integrated circuit of claim 1 wherein said wide bandgap layer is AlGaAs.

6. An integrated circuit for providing low-noise and high-power microwave operation comprising:
   a material structure comprising:
      a semi-insulating GaAs substrate;
      a GaAs buffer layer;
      a GaAs highly-doped low-noise channel layer;
      a GaAs lightly-doped low-noise buffer layer over said low-noise channel layer;
      a GaAs highly-doped power channel layer over said low-noise buffer layer;
      a moderately doped AlGaAs buffer layer over said power channel layer; and
      a GaAs highly-doped cap layer over said AlGaAs buffer layer;
   a low-noise field effect transistor comprising:
      a first source contact to said cap layer;
      a first drain contact to said cap layer, wherein said first source contact and said first drain contact are alloyed and thereby driven into said material structure to make contact with said low-noise channel layer; and
      a first gate contact to said GaAs lightly-doped low-noise buffer layer;
   a power field effect transistor comprising:
      a second source contact to said cap layer;
      a second drain contact to said cap layer, wherein said second source contact and said second drain contact are alloyed and thereby driven into said material structure to make contact with said power channel layer; and
      a second gate contact to said AlGaAs buffer layer, and wherein said first active region and said second active region are separated by a semi-insulating region of said material structure.

7. The integrated circuit of claim 6 wherein said low-noise field effect transistor is an active element in a first amplifier and said power field effect transistor is an active element in a second amplifier.

8. The integrated circuit of claim 7 further comprising a switch comprising a second low-noise field effect transistor.

9. The integrated circuit of claim 7 further comprising a switch comprising a second power field effect transistor.

10. The integrated circuit of claim 7 further comprising a phase shifter comprising a second low-noise field effect transistor.

* * * * *